Feb. 6, 1962

G. A. F. WINCKLER 3,020,325

THERMOELECTRIC DEVICE

Filed Nov. 3, 1958

INVENTOR.
GUNNAR A.F. WINCKLER
BY
Richard S. Strickler

United States Patent Office 3,020,325

Patented Feb. 6, 1962

3,020,325
THERMOELECTRIC DEVICE

Gunnar A. F. Winckler, Milford, Conn., assignor to United Nuclear Corporation, New Haven, Conn., a corporation of Delaware Filed Nov. 3, 1958, Ser. No. 771,438
1 Claim. (Cl. 136—4)

The present invention relates to thermoelectric devices and in particular to that class of such devices utilizing dissimilar metals operative to generate electrical current when a junction or connection between the metals is heated. The invention also relates to a method of generating current utilizing a thermoelectric device.

A typical example of a thermoelectric device is the well-known thermocouple.

Although the invention relates to thermocouples and although reference will be made to conventional thermocouple structures in connection with a description of the invention, it is submitted that the idea here presented in its broad sense is more aptly termed a thermoelectric generator.

It is well known that a conventional thermocouple comprising a pair of dissimilar electrical conductors (a positive element and a negative element such as bismuth and antimony) soldered or welded together at corresponding extremities of the conductors to define a hot junction whose opposite ends are held at a lower temperature, to define a cold junction, will, if connected together at the opposite ends, generate a flow of current within the circuit defined by the conductors.

It is also well known that the maintenance of the temperature differential between the spaced hot and cold junctions is essential to induce a flow of electrons and thus a flow of current from one metal to the other. Heretofore the current generated by such conductors has been very small and the efficiency has been low where among other reasons it is difficult to maintain the temperature differential between the hot and cold junctions since the metal components or elements which make up the thermoelectric device are good electrical conductors and are usually good conductors of heat. Thus, heat from the hot junction drains readily to the cold junction.

In addition, there is a considerable power loss as the current flows from the hot junction along the components of the thermoelectric device to the load.

In contrast to the above function and structure, the present invention is directed to a thermoelectric device which is of the nature of a thermocouple primarily because it contains a positive thermoelectric element and a negative thermoelectric element which cooperate to generate an electric current upon being heated jointly; otherwise the invention introduces an entirely unconventional and radically different structural arrangement.

Accordingly, it is an object of the present invention to provide a novel thermoelectric generator structure.

It is a further object of the invention to provide a thermoelectric generator developing an exceedingly high efficiency.

It is a further feature of the invention to provide a thermoelectric generator structure in which the dissimilar metals are spaced apart at the hot junction.

It is a still further feature of the invention to provide a novel method of generating current.

It is a further object of the invention to provide a thermoelectric structure where the hot junction and the cold junction are exceedingly close to one another.

A further feature of the invention is the provision of a thermoelectric device where the components thereof are spaced apart but are electrically connected by a conducting element which makes point contact with each component.

A thermoelectric device embracing certain features of the invention may comprise a pair of spaced brackets each carrying a thermoelectric element and a conducting element disposed between said thermoelectric elements and making slight areal contact with the thermoelectric elements.

Other features and advantages of the present invention will become more apparent from the succeeding specification when read in conjunction with the appended drawings in which.

Figure 1:
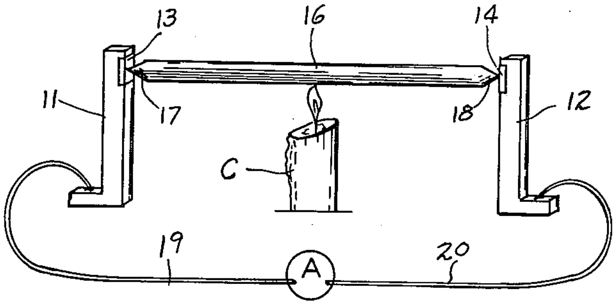
FIG. 1 is a schematic showing of a thermoelectric device embracing the principles of the present invention.

Referring now to the drawings, a pair of metallic brackets or supports 11 and 12 each carrying a thermo element or component in the form of a wafer or button of thermoelectric material such as lead telluride, bismuth telluride, antimony, iron, or the like, with or without traces of other materials admixed. In the disclosed embodiment of the invention, the thermo elements comprise a P-type semi-conductor 13 and an N-type semi-conductor 14. For convenience, the wafers or buttons defining the thermoelectric elements 13 and 14 may be recessed as shown in FIG. 3 to afford a secure mounting.

An electric conductor element 16, in the present embodiment, a tungsten wire, formed at the terminals thereof with cones or protuberances 17 and 18 spans the gap between the brackets 11 and 12 and makes substantially point contact with the thermoelectric elements 13 and 14 respectively.

Figure 3A:
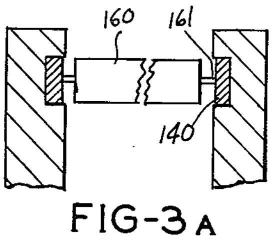
FIG. 3A shows a modified contact arrangement.
Figure 3:
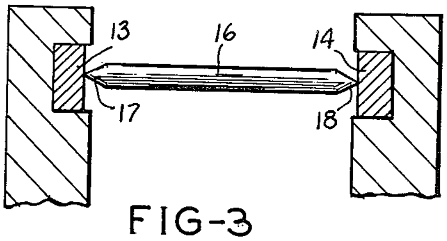
FIG. 3 is an illustration of a portion of the disclosure of FIG. 1 with certain portions thereof enlarged to show the nature of the contact between the conducting element and the thermo elements.

Although point contact is desirable, slight areal contact development by sharply reducing the diameter of the ends of the conducting element as shown in FIG. 3A is satisfactory. For example, the protuberance 161 of the element 160 makes very slight areal contact with the adjacent thermoelectric element 140. Thus, it is intended that the language "point" contact shall include slight areal contact.

Obviously, brackets 11 and 12 must be so constructed and arranged that a squeezing pressure is exerted upon the conductor element 16 so as to maintain the points or protuberances thereof in firm contact with the corresponding thermo elements.

An electrical circuit is completed through a load, here, an ammeter A, by means of the leads 19 and 20.

The device of FIG. 1 operates in the following fashion:

A heat source such as a candle C is effective to heat the conductor element 16 which, in turn, directs heat along the element to the cones or protuberances 17 and 18 and thence directly to the elements 13 and 14. The particular feature to note is that the flow of heat originating with the candle flame and directed along the conductor 16 is focused or funneled at each end of the element 16 by means of the cone structure to a very small area on each thermoelectric element. In effect, the point at which the element 16 contacts its mating thermoelectric element defines the area of and also limits the so-called hot junction of each thermoelectric element.

Stated otherwise, each thermoelectric element 13 and 14 has a hot junction substantially defined by the area of a point or protuberance at which the conductor 16 contracts the thermo element individual thereto; thus, the remaining area of the surface of each thermo element, in effect, defines a cold junction.

Since the cone structure of the conductor 16 tends to funnel and concentrate the flow of heat to a small area, the heat energy is highly concentrated. By imbedding the thermo element in brackets 11 and 12 fabricated of a metal such as silver, brass, copper or aluminum having high thermal and electrical conductivity, a high temperature differential is maintained in each thermo element between the region of areal contact and the main body of the thermo element.

Figure 2:
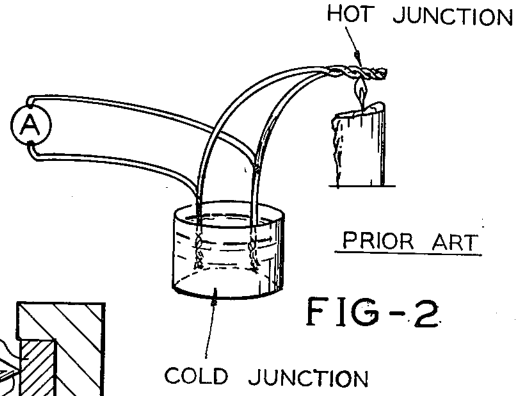
FIG. 2 illustrates a thermoelectric device of the prior art commonly termed a thermocouple.

Referring now to FIG. 2, there is shown a typical prior art thermocouple device wherein the thermoelectric elements are twisted and welded together to define a hot junction. The cold junction is spaced from the hot junction an appreciable distance depending upon the length of leads utilized. As stated previously, in the prior art devices, low currents are developed, because there is difficulty in maintaining a temperature differential between the hot and cold junctions and for the additional reason that a power loss occurs as the current flows from the hot junction to the load.

It is anticipated that packs or composites of thermoelectric devices embracing the principle of the present invention may be devised by utilizing heat developed in stacks, exhaust pipes, fireplaces, or other combustion chamber vents where the power generated will be of sufficient magnitude, in view of the present invention, to operate radios and other light electrical equipment.

Figures 4, 5:
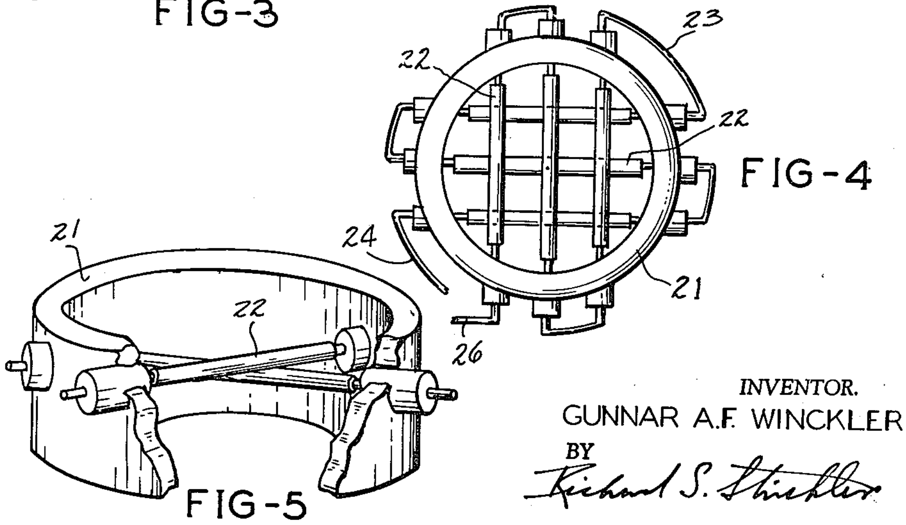
FIG. 4 illustrates a pack or composite of thermoelectric devices, each embracing the principles of the present invention.
FIG. 5 is an illustration of a portion of the disclosure of FIG. 4, somewhat enlarged, to show the detail of the construction and arrangement of the thermoelectric pack.

In FIGS. 4 and 5, there is shown a typical pack of thermoelectric devices wherein a ceramic or firebrick collar 21 is shown supporting a plurality of thermoelectric devices 22 suitably connected together electrically by means of the leads 23. In the arrangement shown a flow of heat such as from a combustion chamber directed through the center of the ceramic ring is effective to operate each thermoelectric device to generate power in the output leads 24 and 26.

A wide variety of structures may be devised to serve as mounts for the thermoelectric device of the present invention and taking advantage of heat sources readily available. For example, the devices may be mounted in firebrick forming the lining of a furnace, the devices may be mounted in the exhaust pipe of an automobile or in the stack of any combustion device.

What is claimed is:

A thermoelectric generator comprising a non-conducting heat resistant collar, a plurality of thermoelectric devices positioned within said collar, electrical means to connect said devices in series, each said device including a pair of dissimilar thermoelectric elements spaced apart and mounted in the collar, an intermediate heat conducting element having protuberances at each end and adapted to make slight areal contact at each end of the conducting element with a dissimilar thermoelectric element to form a hot junction, and to create a high temperature gradient in the region of said junction, said heat conducting elements forming a grid within the collar whereby a source of heat within the collar is operative to activate all said devices simultaneously.

References Cited in the file of this patent

UNITED STATES PATENTS

| | | |
|---|---|---|
| 420,764 | Bradley | Feb. 4, 1890 |
| 2,215,332 | Milnes | Sept. 7, 1940 |
| 2,502,399 | Greeff | Mar. 28, 1950 |

FOREIGN PATENTS

| | | |
|---|---|---|
| 6,869 | Great Britain | May 21, 1886 |